(12) United States Patent
Singor

(10) Patent No.: US 8,355,227 B2
(45) Date of Patent: Jan. 15, 2013

(54) ELECTROSTATIC DISCHARGE CIRCUITRY WITH DAMPING RESISTOR

(75) Inventor: Henry W. Singor, Austin, TX (US)

(73) Assignee: Silicon Laboratories Inc., Austin, TX (US)

( * ) Notice: Subject to any disclaimer, the term of this patent is extended or adjusted under 35 U.S.C. 154(b) by 490 days.

(21) Appl. No.: 12/640,315

(22) Filed: Dec. 17, 2009

(65) Prior Publication Data

US 2011/0150135 A1   Jun. 23, 2011

(51) Int. Cl.
*H02H 9/00* (2006.01)
(52) U.S. Cl. ........................................................... 361/56
(58) Field of Classification Search .................. 361/56
See application file for complete search history.

(56) References Cited

U.S. PATENT DOCUMENTS

| | | | |
|---|---|---|---|
| 6,879,004 B2 | 4/2005 | Leung et al. | |
| 7,102,865 B2 | 9/2006 | Lu et al. | |
| 7,348,809 B2 | 3/2008 | Eldredge | |
| 7,362,554 B2 | 4/2008 | Austin et al. | |
| 2001/0024348 A1* | 9/2001 | May et al. | 361/56 |
| 2003/0071696 A1* | 4/2003 | Kubo et al. | 331/176 |
| 2003/0102813 A1* | 6/2003 | Humphrey et al. | 315/169.3 |
| 2007/0133137 A1 | 6/2007 | Dornbusch | |
| 2008/0002318 A1 | 1/2008 | Webb | |
| 2008/0013243 A1 | 1/2008 | Gammel et al. | |
| 2008/0129574 A1* | 6/2008 | Choi et al. | 341/166 |
| 2008/0238789 A1* | 10/2008 | Wilcox | 343/750 |
| 2009/0243570 A1 | 10/2009 | Hulfachor et al. | |

* cited by examiner

*Primary Examiner* — Jared Fureman
*Assistant Examiner* — Scott Bauer
(74) *Attorney, Agent, or Firm* — O'Keefe, Egan, Peterman & Enders LLP

(57) ABSTRACT

An apparatus formed on a substrate includes a pad, electrostatic discharge circuitry, and a metal damping resistor connected between the pad and the electrostatic discharge circuitry.

24 Claims, 7 Drawing Sheets

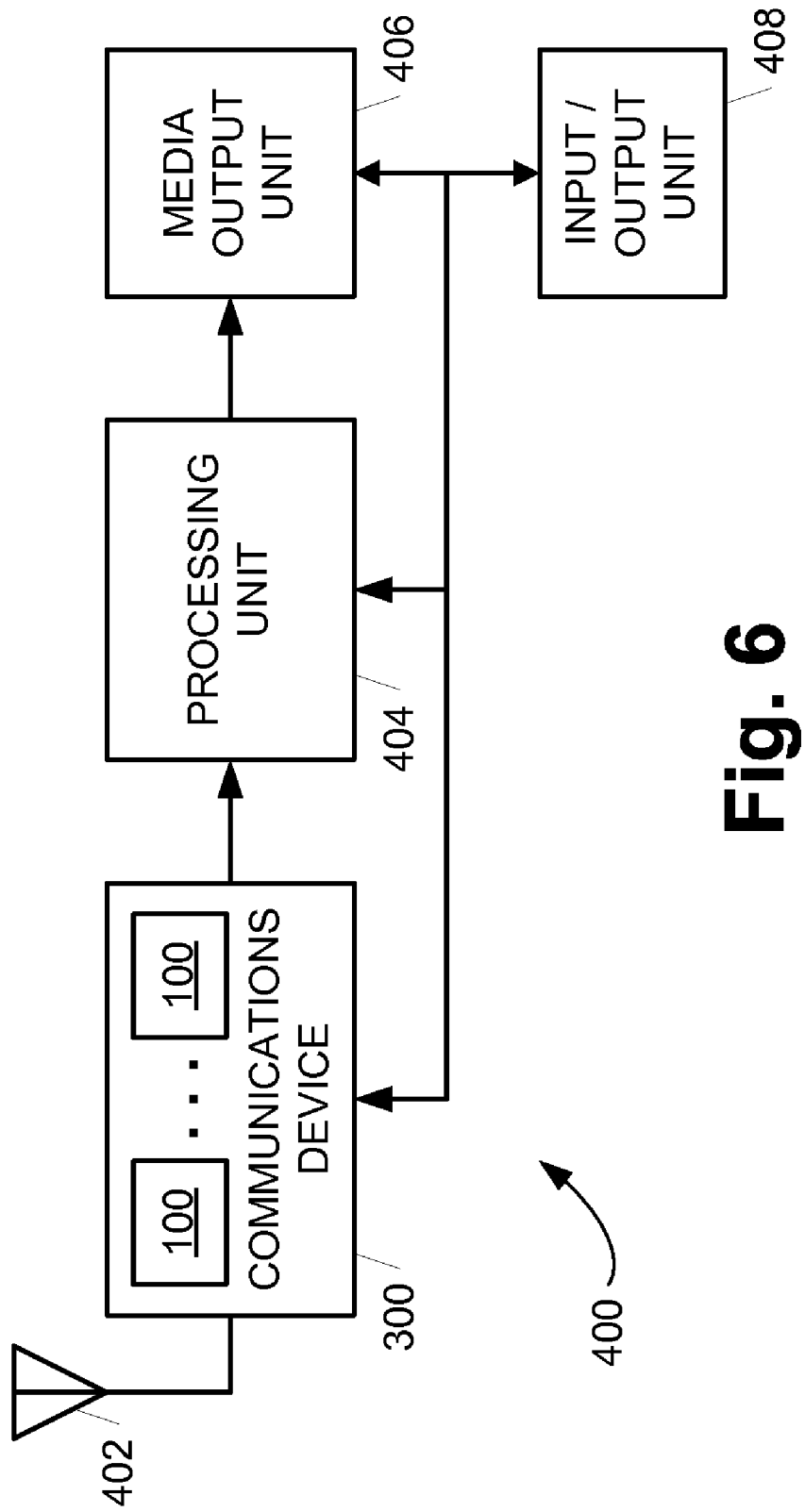

US 8,355,227 B2

ELECTROSTATIC DISCHARGE CIRCUITRY WITH DAMPING RESISTOR

BACKGROUND

An integrated circuit is typically contained in a package that includes conductive pins that connect to pads on the integrated circuit. The pins allow electrical signals to be transferred between the integrated circuit and other circuitry, such as circuitry on a motherboard. Because the pins provide external access to the integrated circuit, the pins expose the integrated circuit to the possibility of an electrostatic discharge (ESD) which may occur if a pin is brought near to or into contact with an object, a person, or a surface that is charged to a different potential. ESD is a sudden and momentary flow of charge between the integrated circuit and the other object.

To prevent ESD from damaging an integrated circuit, the integrated circuit generally includes ESD protection circuitry on any pins that may transfer an ESD to or from the integrated circuit. Unfortunately, the combination of ESD protection circuitry and other structures that connect the pin to the integrated circuit may produce undesired electrical properties that adversely affect the performance of some types of integrated circuits. It would be desirable to protect an integrated circuit from ESD without impacting the operation of the integrated circuit.

SUMMARY

According to one exemplary embodiment, an apparatus formed on a substrate is provided. The apparatus comprises a pad, electrostatic discharge circuitry, and a metal damping resistor connected between the pad and the electrostatic discharge circuitry.

According to another exemplary embodiment, a system is provided. The system comprises a substrate, device circuitry formed on the substrate, and a set of pad structures formed on the substrate and configured to transmit electrical signals to and from the device circuitry. Each pad structure includes a pad, electrostatic discharge circuitry, and a metal damping resistor connected between the pad and the electrostatic discharge circuitry.

According to a further exemplary embodiment, a media system is provided. The media system comprises a communications device configured to receive an analog input signal and generate an output signal and a processing unit configured to generate a media signal in response to the output signal from the communications device. The communications device includes communications device circuitry and a set of pad structures configured to transmit electrical signals to and from the device circuitry. Each pad structure includes a pad, electrostatic discharge circuitry, and a metal damping resistor connected between the pad and the electrostatic discharge circuitry.

BRIEF DESCRIPTION OF THE DRAWINGS

FIG. 6 is a block diagram illustrating one embodiment of a media system that includes a communications device.

DETAILED DESCRIPTION

In the following Detailed Description, reference is made to the accompanying drawings, which form a part hereof, and in which is shown by way of illustration specific embodiments in which the invention may be practiced. In this regard, directional terminology, such as "top," "bottom," "front," "back," "leading," "trailing," etc., is used with reference to the orientation of the Figure(s) being described. Because components of embodiments of the present invention can be positioned in a number of different orientations, the directional terminology is used for purposes of illustration and is in no way limiting. It is to be understood that other embodiments may be utilized and structural or logical changes may be made without departing from the scope of the present invention. The following detailed description, therefore, is not to be taken in a limiting sense, and the scope of the present invention is defined by the appended claims.

Figure 1:
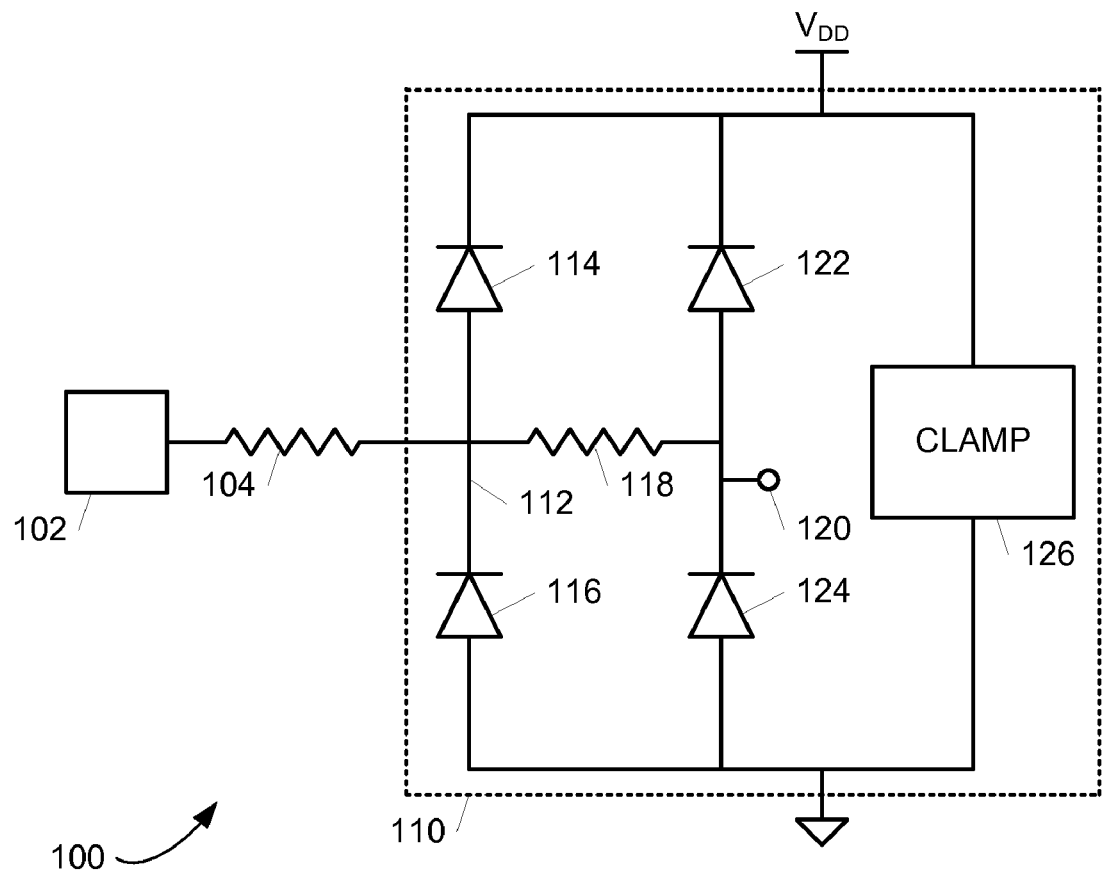
FIG. 1 is a circuit diagram illustrating one embodiment of a pad structure on an integrated circuit.

FIG. 1 is a block diagram illustrating one embodiment of a pad structure 100 of an integrated circuit that includes a pad 102, a damping resistor 104, and electrostatic discharge (ESD) protection circuitry 110 (hereafter ESD circuitry 110). The integrated circuit is formed on a substrate, such as a substrate 140 shown in FIG. 2 and described in additional detail below, by depositing conductive, dielectric, and other suitable materials into and on top of the substrate.

Pad 102 is a conductive metal contact formed on an integrated circuit that connects to a conductive lead (not shown) that, in turn, connects to a pin (not shown) on a lead frame (not shown) of an integrated circuit package (not shown). The pin provides an electrical connection between a circuit board or other circuitry (not shown) and the integrated circuit. Pad 102 is configured to allow electrical signals to be transmitted between the pin and the integrated circuit. Pad 102 may be an input pad configured to receive input signals from the pin and transmit the input signals to the integrated circuit, an output pad configured to receive output signals from the integrated circuit and transmit the input signals to the pin, or an input/output pad configured to function as both an input and an output pad.

ESD circuitry 110 includes a node 112 that connects to a resistor 104 which, in turn, connects to pad 102. ESD circuitry 110 is configured to prevent electrostatic discharge conducted through pad 102 and resistor 104 from damaging the integrated circuitry connected to a node 120. ESD circuitry 110 includes a primary positive strike diode 114 configured to limit excess positive voltages generated by electrostatic discharge on node 112 to a voltage supply node $V_{DD}$ and a primary negative strike diode 116 configured to limit excess negative voltages generated by electrostatic discharge on node 112. Diode 114 limits excess positive voltages at node 112 by conducting current to a voltage supply node $V_{DD}$, and diode 116 limits excess negative voltages at node 112 by conducting current from a ground node. ESD circuitry 110 also includes a secondary resistor 118 connected between nodes 112 and 120, a secondary positive strike diode 122, and a secondary negative strike diode 124. Diode 122 limits excess positive voltages at node 120 by conducting current to the voltage supply node, and diode 124 limits excess negative voltages at node 120 by conducting current from a ground node. ESD circuitry 110 further includes clamp circuitry 126 configured to conduct ESD currents from the voltage supply node to the ground node.

In other embodiments, secondary resistor 118, secondary positive strike diode 122, and secondary negative strike diode 124 may be omitted and ESD circuitry 110 may be configured to prevent electrostatic discharge conducted through pad 102 and resistor 104 from damaging the integrated circuitry connected to node 112.

Damping resistor 104 is a conductive metal resistive element configured to provide a resistance between pad 102 and node 112. Damping resistor 104 is configured to minimize the mutual inductance between the conductive structures that include pad 102, the lead, and the pin on the lead frame and other circuitry on the integrated circuit. The mutual inductance may create undesirable noise or spurs on the integrated circuit that result in performance degradations. The conductive structures that include pad 102, the lead, and the pin on the lead frame form a natural inductor that combines with capacitances generated by diodes 114 and 116 to create an LC tank (i.e., a transformer). The amount of mutual inductance generated by the LC tank is proportional to the quality factor (i.e., the Q) of the LC tank. Damping resistor 104 reduces the Q of the LC tank to minimize the mutual inductance with other circuitry on the integrated circuit and thereby minimize any performance degradation of the integrated circuit caused by mutual inductance.

Damping resistor 104 may be configured with any suitable nominal value that sufficiently reduces the Q of the LC tank such that the mutual inductance between the LC tank and other circuitry on the integrated circuit does not adversely affect the performance of the integrate circuit. In one embodiment, damping resistor 104 may have a nominal value of 25 ohms. In other embodiments, damping resistor 104 may have any suitable nominal value that is greater than or equal to 10 ohms.

Damping resistor 104 is formed with metal, such as aluminum or copper, rather than polysilicon in the embodiments described herein. Damping resistor 104 forms a continuous and uninterrupted metal conductor between the metal that forms pad 102 and the metal that forms node 112 as shown in the schematic layout diagrams of FIGS. 2A-2E.

Figure 2A:
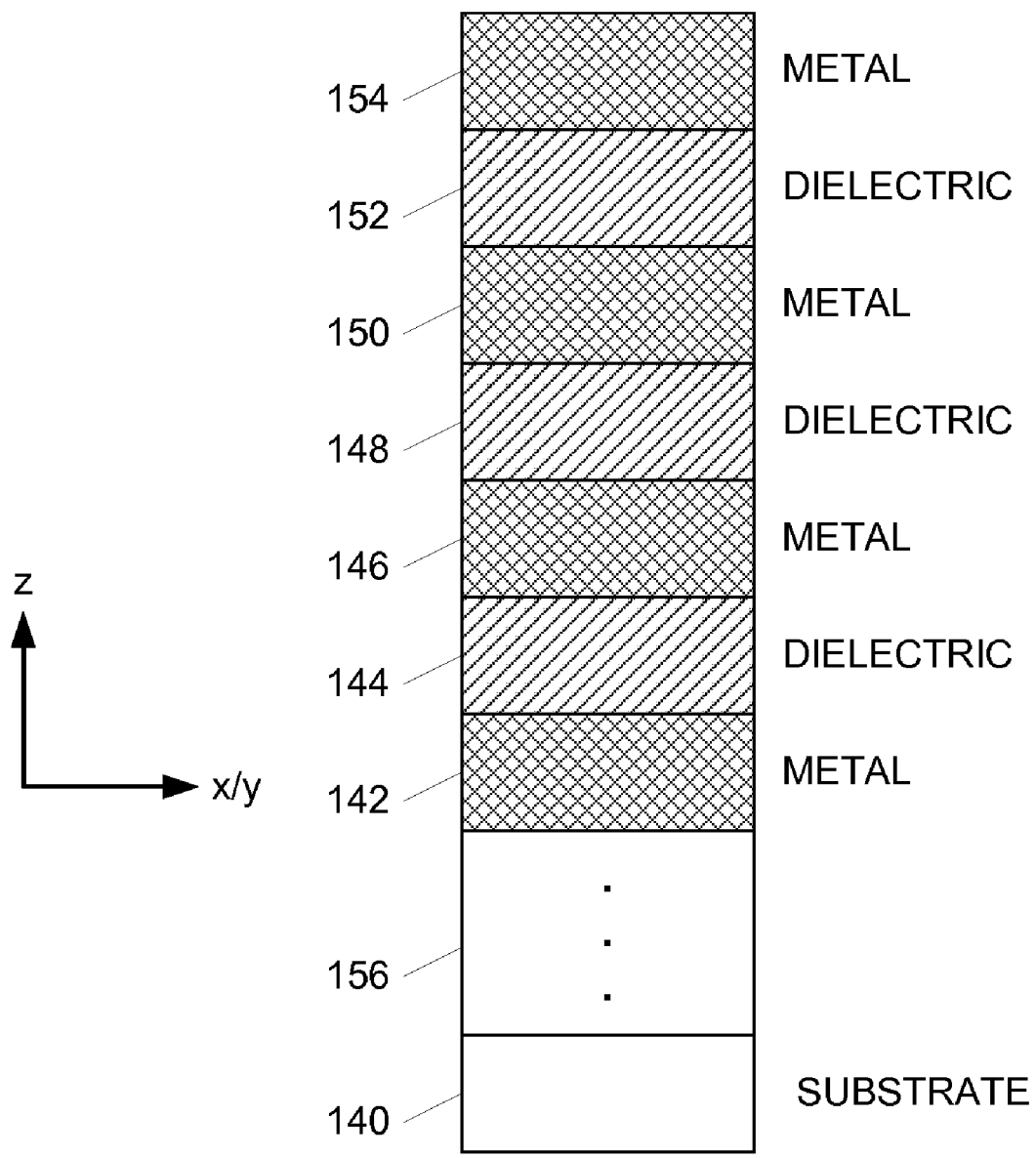
FIGS. 2A-2E are schematic diagrams illustrating embodiments of layers of an integrated circuit.

FIG. 2A is a cross sectional view diagram illustrating an embodiment of an integrated circuit formed in any suitable number of layers of material on a semiconductor substrate 140 using any suitable semiconductor manufacturing process. As shown in FIG. 2A, substrate 140 extends in an x-y plane and layers are formed on the substrate in the z-direction.

The integrated circuit includes metal layers 142, 146, 150, and 154 with dielectric layers 144, 148, and 152 between the metal layers. The integrated circuit also includes any additional number of metal, dielectric, and active circuitry layers 156 between metal layer 142 and substrate 140.

Figure 2B:
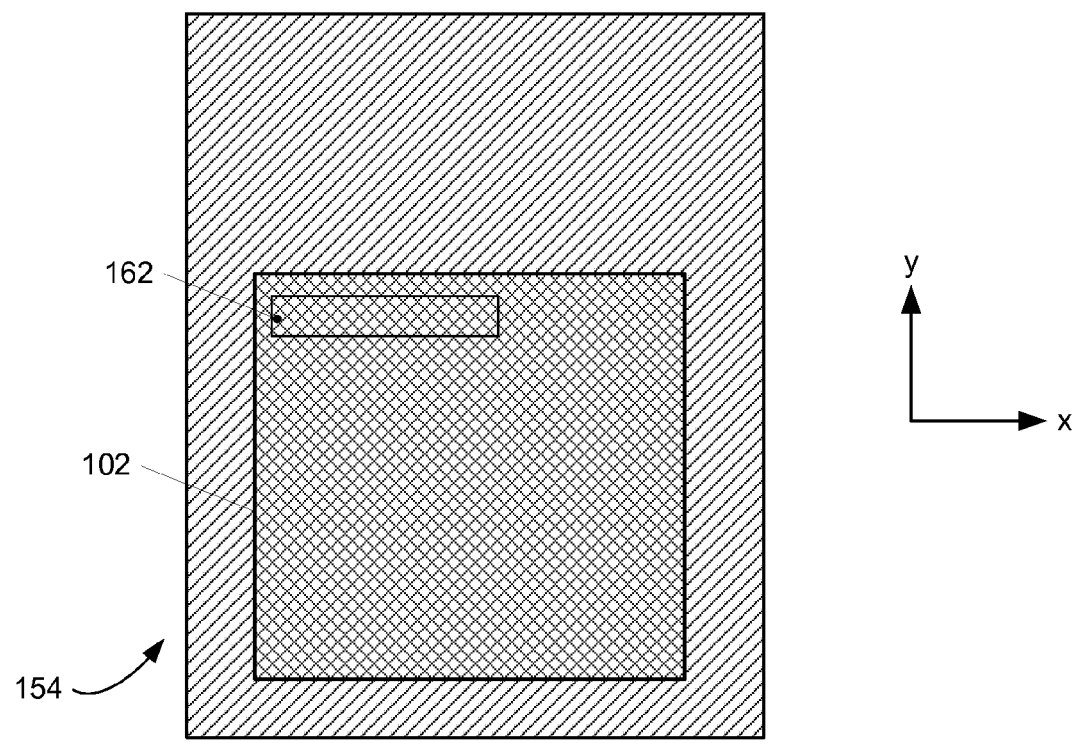
Figure 2C:
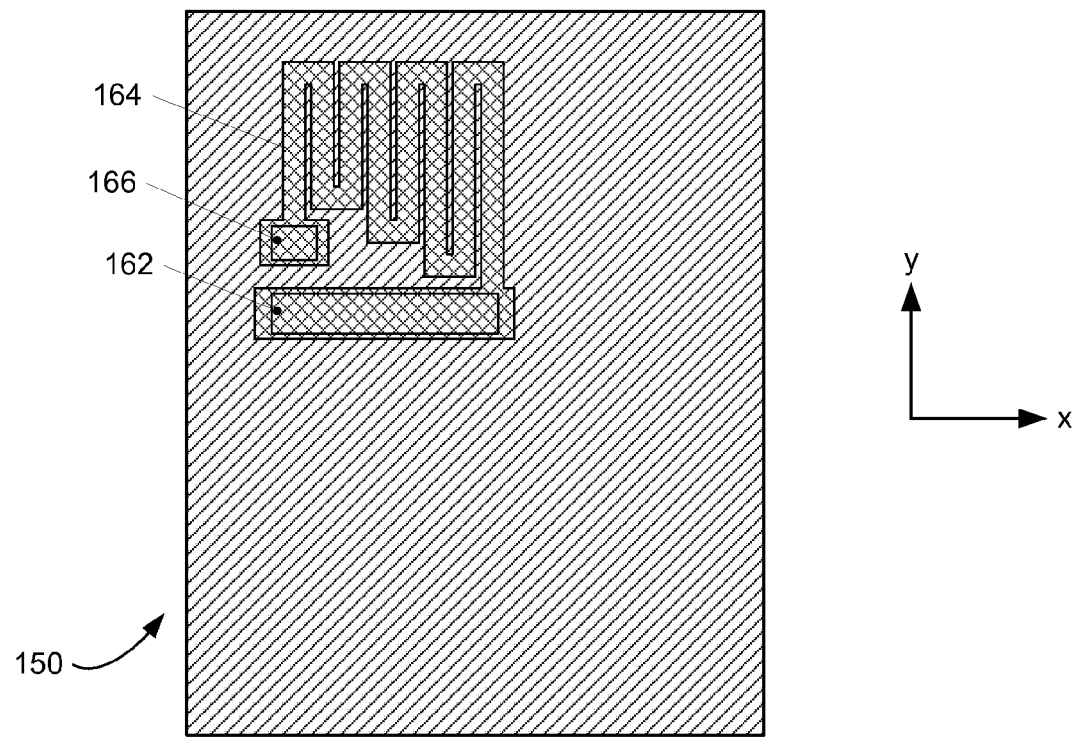
Figure 2D:
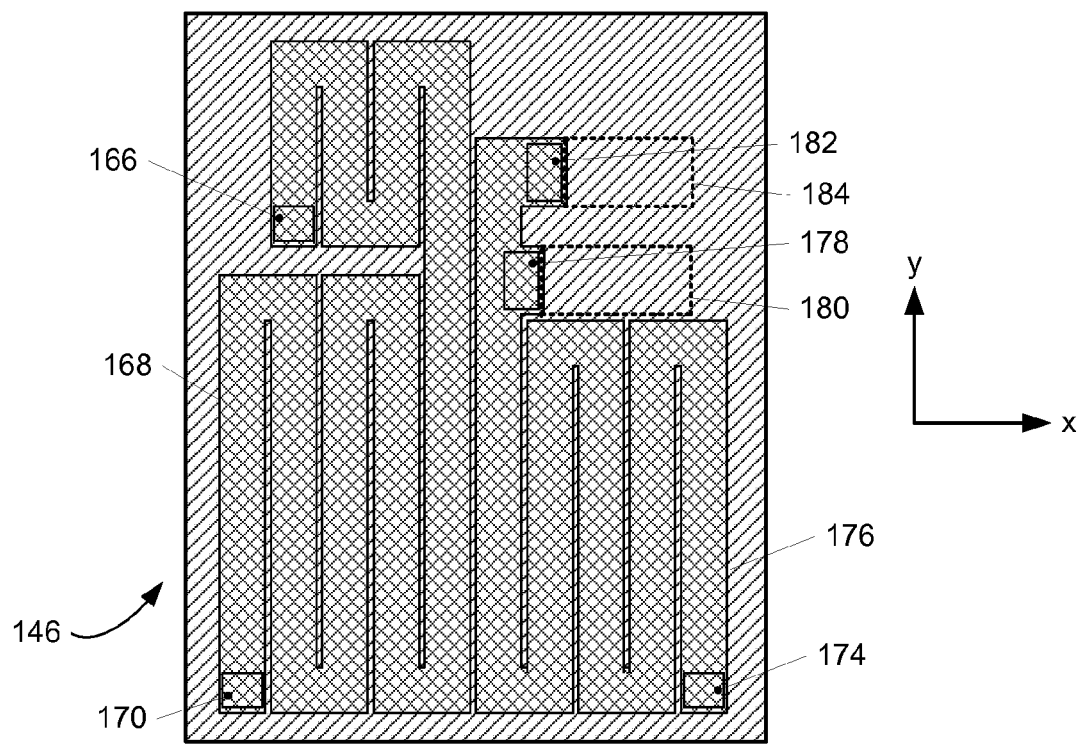
Figure 2E:
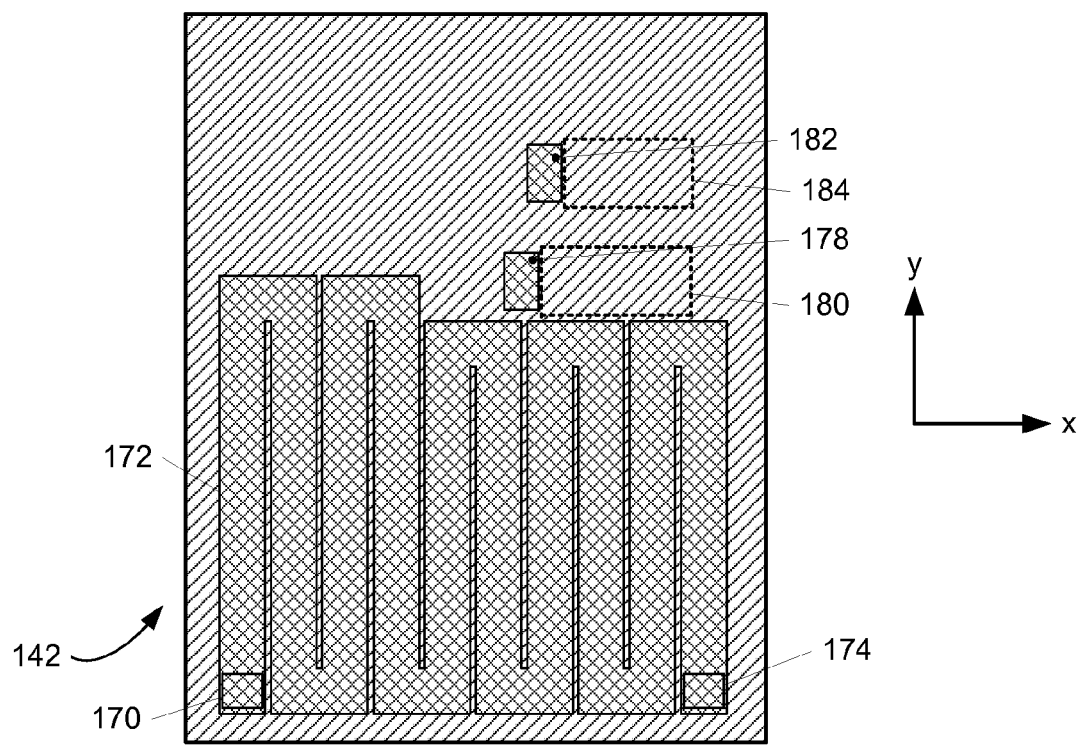

FIGS. 2B-2E are top view diagrams illustrating embodiments of portions of metal layers 154, 150, 146, and 142, respectively, in the x-y plane. In FIG. 2B, metal layer 154 includes pad 102 which connects to a metal via 162 that forms the first portion of damping resistor 104. Via 162 extends through dielectric layer 152 to connect with metal 164 in metal layer 150 as shown in FIG. 2C. Metal 164 zigzags back and forth in metal layer 150 and connects to a metal via 166 that extends through dielectric layer 148 to connect with metal 168 in metal layer 146 as shown in FIG. 2D. Metal 168 zigzags back and forth, extends across, and again zigzags back and forth in metal layer 146 before connecting to a metal via 170 that extends through dielectric layer 144 to connect with metal 172 in metal layer 142 as shown in FIG. 2E. Metal 172 zigzags back and forth in metal layer 142 and connects to a metal via 174 that extends back up through dielectric layer 144 to connect with metal 176 in metal layer 146 as shown in FIG. 2D. Metal 176 zigzags back and forth in metal layer 146 and connects to metal vias 178 and 182.

Vias 178 and 182 extend down to substrate 140 through dielectric layer 144, metal layer 142, and any additional metal, dielectric, and active circuitry layers 156 between metal layer 142 and substrate 140. Via 178 connects to an area 180 of active circuitry in substrate 140 that forms diode 114, and via 182 connects to an area 184 of active circuitry in substrate 140 that forms diode 116. The positions of areas 180 and 184 in substrate 140 are shown relative to metal layers 146 and 142 in FIGS. 2D and 2E, respectively.

In the above embodiments, metals 164, 168, 172, and 176 are configured to largely parallel one another in adjacent metal layers to minimize the inductance formed by damping resistor 104.

In the embodiment of FIGS. 2A-2E, damping resistor 104 is formed in metal layers 142, 146, and 150 with metal vias in dielectric layers 144, 148, and 152 and metal vias in any metal, dielectric, and active circuitry layers in layers 156. In other embodiments, damping resistor 104 may be formed in other suitable numbers and/or arrangements of metal and dielectric layers.

In being formed with metal, damping resistor 104 may have more desirable properties than a resistor formed with polysilicon. For example, the metal that forms damping resistor 104 may have a higher current handing capability than a resistor formed with polysilicon. In addition, the metal that forms damping resistor 104 may have a temperature coefficient that stays positive over the entire range of operating temperatures than a resistor formed with polysilicon where the temperature coefficient of polysilicon may become negative at higher operating temperatures. Further, the metal that forms damping resistor 104 may be located away from active circuitry in substrate 140 as shown in the embodiments of FIGS. 2A-2E. Because of this, active circuitry in substrate 140 may be less susceptible to damage from ESD because of the distance between damping resistor 104 and the active circuitry. Further, the use of metal to form damping resistor 104 may allow pad structure 100 to be made smaller.

Figure 3:
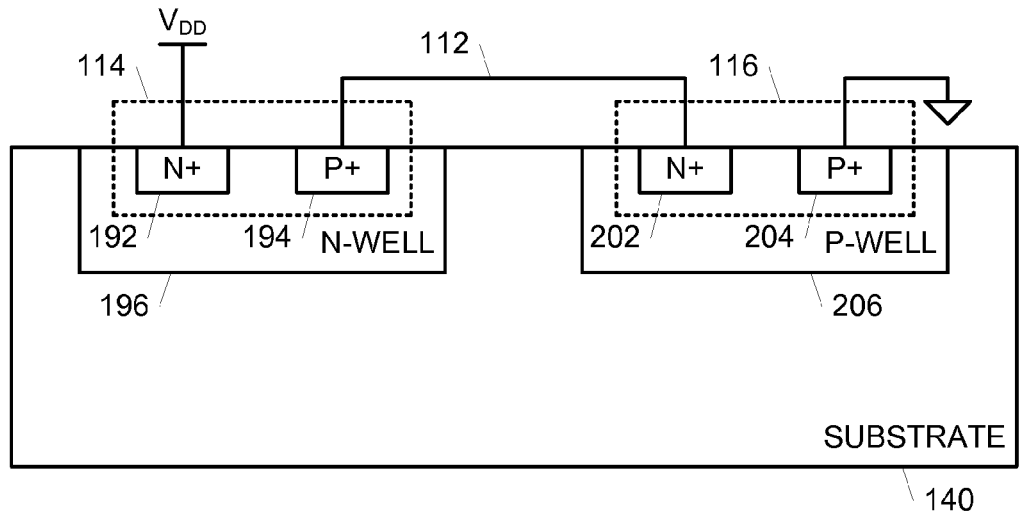
FIG. 3 is a circuit diagram illustrating one embodiment of diode circuitry.

FIG. 3 is a circuit diagram illustrating one embodiment of diode circuitry in substrate 140. Substrate 140 includes an N+ region 192 and a P+ region 194 in an N-well 196 that form diode 114 (FIG. 1). N+ region 192 is connected to the voltage supply node $V_{DD}$, and P+ region 194 is connected to node 112. Substrate 140 also includes an N+ region 202 and a P+ region 204 in a P-well 206 that form diode 116 (FIG. 1). N+ region 202 is connected to node 112, and P+ region 204 is connected to the ground node.

Diodes 122 and 124 may be formed on substrate 140 similarly to the embodiment of the diode circuitry of diodes 114 and 116 shown in FIG. 3 (not shown).

Figure 4:
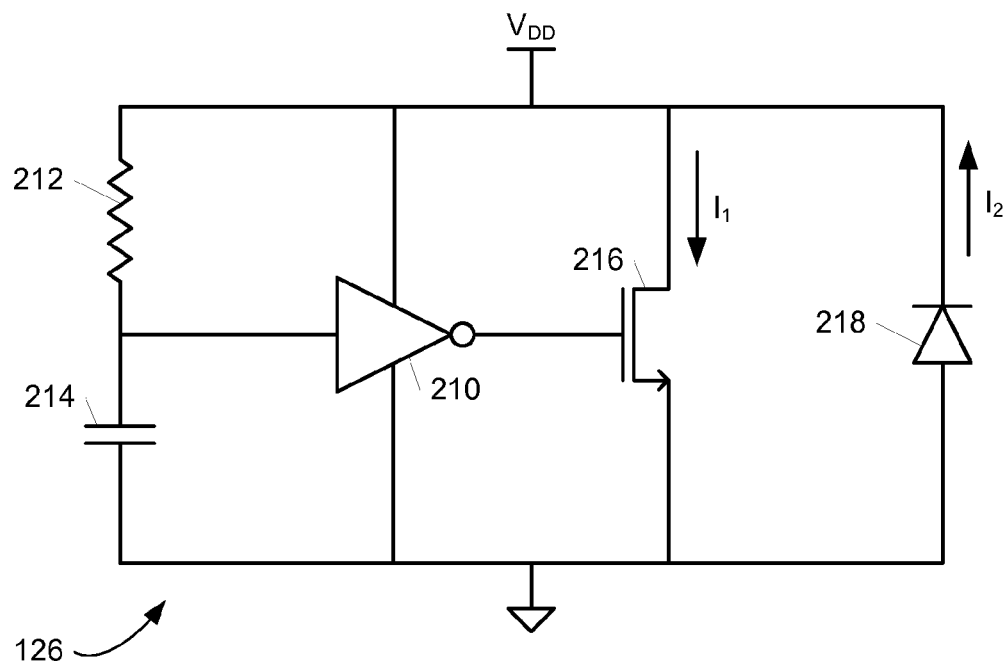
FIG. 4 is a circuit diagram illustrating one embodiment of clamp circuitry.

FIG. 4 is a circuit diagram illustrating one embodiment of clamp circuitry 126. Clamp circuitry 126 includes an inverter 210. A resistor 212 is formed between the voltage supply node and the input of inverter 210, and a capacitor is formed between the input of inverter 210 and the ground node. The output of inverter 210 connects to the base of a transistor 216 that has source and drain connections coupled to the voltage supply node and the ground node, respectively. A diode 218 also connects between the voltage supply node and the ground node.

Clamp circuitry 126 operates to maintain the voltage between the voltage supply node and the ground node by conducting a current $I_1$ if a large, positive transient voltage is detected on the voltage supply node. If the voltage supply node is driven to a voltage that is lower than the ground node by an ESD event, current $I_2$ will become large and clamp the voltage at the voltage supply node to a voltage that is near ground.

Referring back to FIG. 1, secondary resistor 118 may be formed using metal or polysilicon. If metal is used, secondary resistor 118 may be located away from the active circuitry in substrate 140 that forms diodes 114, 116, 122, and 124 and maintain a positive temperature coefficient across the entire range of operating temperatures. If polysilicon is used, secondary resistor 118 may be made smaller than if metal is used because of the higher resistance value that polysilicon provides over a smaller area compared to metal.

Figure 5:
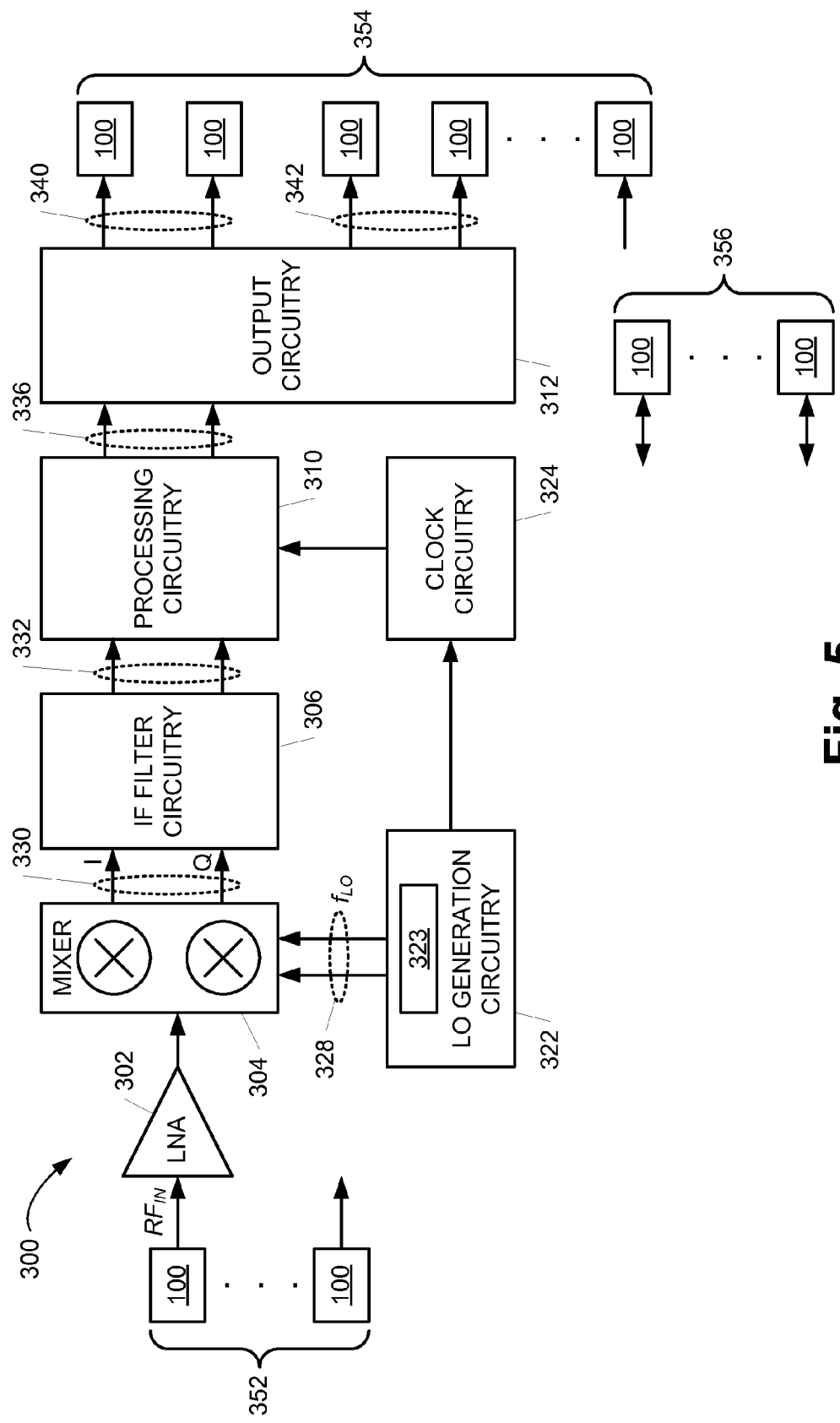
FIG. 5 is a block diagram illustrating one embodiment of selected portions of a communications device.

Pad structure 100, shown in FIG. 1, may be used with a wide variety of devices such as communications devices formed as an integrated circuit. FIG. 5 is a block diagram illustrating one embodiment of selected portions of a low intermediate frequency (low-IF) receiver 300 with a pad structure 100 for each pin of receiver 300. Receiver 300 includes a low noise amplifier (LNA) 302, a mixer 304, low intermediate frequency (IF) filter circuitry 306, processing circuitry 310, output circuitry 312, local oscillator generation circuitry 322, and clock circuitry 324. Receiver 300 also includes a set 352 of pad structures 100 with a pad structure 100 for each input signal (e.g., a radio-frequency (RF) input signal ($RF_{IN}$)), a set 354 of pad structures 100 with a pad structure 100 for each output signal (e.g., a digital audio and/or video media output 340 and an analog audio and/or video media output 342), and a set 356 of pad structures 100 with a pad structure 100 for each bi-directional signal.

Receiver 300 is configured to receive and process the RF signal ($RF_{IN}$) to generate digital audio and/or video media output 340 and/or analog audio and/or video media output 342. Receiver 300 forms an integrated terrestrial or cable broadcast receiver configured to receive RF signals. As used herein, an RF signal means an electrical signal conveying useful information and having a frequency from about 3 kilohertz (kHz) to thousands of gigahertz (GHz), regardless of the medium through which the signal is conveyed. Thus, an RF signal may be transmitted through air, free space, coaxial cable, and/or fiber optic cable, for example. Accordingly, receiver 300 may receive the RF signal from a wired or wireless medium. In other embodiments, receiver 300 may be configured to receive signals in another suitable frequency range.

LNA 302 receives the RF signal and generates an amplified output signal. The output of LNA 302 is then applied to mixer 304, and mixer 304 generates in-phase (I) and quadrature (Q) output signals, as represented by signals 330. To generate low-IF signals 330, mixer 304 uses phase shifted local oscillator (LO) mixing signals 328. LO generation circuitry 322 includes controlled oscillation circuitry 323 (e.g., a voltage controlled oscillator) and outputs two out-of-phase LO mixing signals 328 that are used by mixer 304. The outputs of mixer 304 are at a low-IF which may be fixed or designed to vary, for example, if discrete step tuning is used for LO generation circuitry 322. LO generation circuitry 322 also provides a reference signal to clock circuitry 324. Clock circuitry 324 generates a clock signal from the reference signal and provides the clock signal to processing circuitry 310.

Low-IF filter circuitry 306 receives the in-phase (I) and quadrature (Q) signals 330 and outputs in-phase and quadrature digital signals, as represented by signals 332. Low-IF filter circuitry 306 provides, in part, signal gain and signal filtering functions. Mixer 304 mixes the target channel within the input signal spectrum down to an IF that is equal to or below about three channel widths. For spectrums with non-uniform channel spacings, a low IF frequency may be equal to or below about three steps in the channel tuning resolution of the receiver circuitry. For example, if the receiver circuitry were configured to tune channels that are at least about 100 kHz apart, a low IF frequency would be equal to or below about 300 kHz. The IF frequency may be fixed at a particular frequency or may vary within a low-IF ranges of frequencies, depending upon the LO generation circuitry utilized and how it is controlled. Low-IF filter circuitry 306 provides signals 332 to processing circuitry 310.

Processing circuitry 310 performs digital filtering and digital signal processing to further tune and extract the signal information from digital signals 332. Processing circuitry 310 produces baseband digital media signals 336. When the input signals relate to analog television broadcasts, the digital processing provided by processing circuitry 310 may include, for example, analog television demodulation. Processing circuitry 310 provides baseband digital media signals 336 to output circuitry 312.

Output circuitry 312 outputs baseband digital media signals 336 as digital media output signals 340 in any suitable digital format such as an IF I/Q format (e.g., low-IF (LIF) or zero-IF (ZIF) I/Q). Output circuitry 312 may also convert the digital baseband digital media signals 336 into analog media output signals 342 in any suitable analog format such as composite video baseband signal (CVBS) and/or sound IF/audio frequency (SIF/AF).

In the embodiment of FIG. 5, damping resistors 104 in pad structures 100 are configured to minimize the mutual inductance between the conductive structures that include pads 102, the leads, and the pins on the lead frame and controlled oscillator circuitry 323. Controlled oscillator circuitry 323 includes one or more inductors (not shown) and one or more capacitors (not shown) that form an LC tank that generates a reference signal at a desired frequency. By reducing the Q of the LC tank formed by the conductive structures that include pads 102, the leads, and the pins on the lead frame, damping resistors 104 minimize the mutual inductance with the LC tank of controlled oscillator circuitry 323 to prevent spurs or noise from undesirably altering the frequency of the reference signal generated by controlled oscillator circuitry 323.

FIG. 6 is a block diagram illustrating one embodiment of a media system 400 that includes communications device 300 with pad structures 100 as shown in FIG. 5. Media system 400 may be any type of portable or non-portable system configured to provide a media output such as a mobile or cellular telephone, a personal digital assistant (PDA), an audio and/or video player (e.g., an MP3 or DVD player), and a notebook or laptop computer.

Media system 400 includes communications device 300 that receives a media transmission from an antenna 402 or other suitable input and provides a digital and/or analog media signal to a processing unit 404. Processing unit 404 performs any suitable processing on the media signal (e.g., television demodulation on a digital baseband signal) and provides the processed signal to a media output unit 406 for output to a user. Processing unit 404 may be omitted in some embodiments such that the media signal from communications device 300 may be provided directly to media output unit 406 in these embodiments. Media output unit 406 may include any suitable type and/or combination of audio and/or video output devices such as a television, a monitor, a display screen, a speaker, or headphones.

An input/output unit 408 receives inputs from a user and provides the inputs to communications device 300, processing unit 404, and/or media output device 406. Input/output unit 408 also receives outputs from communications device 300, processing unit 404, and/or media output device 406 and provides the outputs to a user. The inputs and outputs may include voice and/or data communications, audio, video, image, and/or other graphical information. Input/output unit 408 includes any number and types of input and/or output devices to allow a user provide inputs to and receive outputs from media system 400. Examples of input and output devices include a microphone, a speaker, a keypad, a pointing or selecting device, and a display device.

In the above embodiments, a variety of circuit and process technologies and materials may be used to implement the circuitries, devices, and systems. Examples of such technologies include metal oxide semiconductor (MOS), p-type MOS (PMOS), n-type MOS (NMOS), complementary MOS (CMOS), silicon-germanium (SiGe), gallium-arsenide (GaAs), silicon-on-insulator (SOI), bipolar junction transistors (BJTs), and a combination of BJTs and CMOS (BiCMOS).

Although specific embodiments have been illustrated and described herein, it will be appreciated by those of ordinary skill in the art that a variety of alternate and/or equivalent implementations may be substituted for the specific embodiments shown and described without departing from the scope of the present invention. This application is intended to cover any adaptations or variations of the specific embodiments discussed herein. Therefore, it is intended that this invention be limited only by the claims and the equivalents thereof.

What is claimed is:

1. An apparatus formed on a substrate, the apparatus comprising:
   a pad;
   electrostatic discharge circuitry; and
   a metal damping resistor connected between the pad and the electrostatic discharge circuitry, the metal damping resistor being configured to conduct an electrostatic discharge between the pad and the electrostatic discharge circuitry;
   where the metal damping resistor comprises a first planar metal portion separated from a second planar metal portion by a dielectric layer disposed therebetween, the plane of the first planar metal portion being oriented in substantially parallel relationship to the plane of the second planar metal portion; and where the first planar metal portion is coupled to the second planar metal portion by a metal via that extends through the dielectric layer between the first planar metal portion and the second planar metal portion in a direction that is substantially perpendicular to the plane of the first planar metal portion and the second planar metal portion; and
   where the electrostatic discharge circuitry comprises active circuitry formed on the substrate; where the first planar metal portion is coupled to the active circuitry on the substrate by a metal via that extends in a direction that is substantially perpendicular to the plane of the first planar metal portion and the second planar metal portion; and where the active circuitry is disposed between the substrate and the first planar metal portion, and where the first planar metal portion is disposed between the active circuitry and the second planar metal portion.

2. The apparatus of claim 1 wherein the metal damping resistor is configured to minimize mutual inductance between a lead connected to the pad and other circuitry on the substrate.

3. The apparatus of claim 1 wherein the metal damping resistor has a positive temperature coefficient across an entire range of operating temperatures.

4. The apparatus of claim 1 wherein the metal damping resistor is formed substantially away from active circuitry on the substrate.

5. The apparatus of claim 1 wherein the metal damping resistor is formed in a plurality of metal layers on the substrate, the metal damping resistor comprising three or more metal layers separated from each other by dielectric layers, the metal layers being coupled together with metal vias extending through the dielectric layers to form the resistor.

6. The apparatus of claim 1 wherein the electrostatic discharge circuitry includes a primary positive strike diode connected between the metal damping resistor and a voltage supply node, and wherein the electrostatic discharge circuitry includes a primary negative strike diode connected between the metal damping resistor and a ground node.

7. The apparatus of claim 6 wherein the electrostatic discharge circuitry includes clamp circuitry connected between the voltage supply node and the ground node.

8. The apparatus of claim 7 wherein the electrostatic discharge circuitry includes a secondary resistor connected to the metal damping resistor, wherein the electrostatic discharge circuitry includes a secondary positive strike diode connected between the secondary resistor and the voltage supply node, and wherein the electrostatic discharge circuitry includes a secondary negative strike diode connected between the metal damping resistor and the ground node.

9. The apparatus of claim 1 where the metal damping resistor comprises:
   a first planar metal portion separated from a second planar metal portion by a first dielectric layer disposed therebetween, the plane of the first planar metal portion being oriented in substantially parallel relationship to the plane of the second planar metal portion;
   a third planar metal portion separated from the second planar metal portion by a second dielectric layer disposed therebetween, the plane of the third planar metal portion being oriented in substantially parallel relationship to the plane of the first and second planar metal portions, and the second planar metal portion being disposed between the first planar metal portion and third planar metal portion;
   where the first planar metal portion is coupled to the second planar metal portion by a first metal via that extends through the first dielectric layer between the first planar metal portion and the second planar metal portion in a direction that is substantially perpendicular to the plane of the first planar metal portion and the second planar metal meal portion; and
   where the third planar metal portion is coupled to the second planar metal portion by a second metal via that extends through the second dielectric layer between the second planar metal portion and the third planar metal portion in a direction that is substantially perpendicular to the plane of the second planar metal portion and the third planar metal meal portion.

10. The apparatus of claim 1 where the first planar metal portion of the metal damping resistor comprises a first elongated conductor that zigzags back and forth in the plane of the first planar metal portion; where the second planar metal portion of the metal damping resistor comprises a second elongated conductor that zigzags back and forth in the plane of the second planar metal portion; and where the first elongated conductor is coupled to the second elongated conductor by the metal via that extends through the dielectric layer.

11. A system comprising:
    a substrate;
    device circuitry formed on the substrate; and a set of pad structures formed on the substrate and configured to transmit electrical signals to and from the device circuitry;

wherein each pad structure includes a pad, electrostatic discharge circuitry, and a metal damping resistor connected between the pad and the electrostatic discharge circuitry, the metal damping resistor being configured to conduct an electrostatic discharge between the pad and the electrostatic discharge circuitry;

where the metal damping resistor comprises a first planar metal portion separated from a second planar metal portion by a dielectric layer disposed therebetween, the plane of the first planar metal portion being oriented in substantially parallel relationship to the plane of the second planar metal portion; and where the first planar metal portion is coupled to the second planar metal portion by a metal via that extends through the dielectric layer between the first planar metal portion and the second planar metal portion in a direction that is substantially perpendicular to the plane of the first planar metal portion and the second planar metal portion; and where the electrostatic discharge circuitry comprises active circuitry formed on the substrate; where the first planar metal portion is coupled to the active circuitry on the substrate by a metal via that extends in a direction that is substantially perpendicular to the plane of the first planar metal portion and the second planar metal portion; and where the active circuitry is disposed between the substrate and the first planar metal portion, and where the first planar metal portion is disposed between the active circuitry and the second planar metal portion.

12. The system of claim 11 wherein the device circuitry forms a communications device.

13. The system of claim 12 wherein the communications device includes a controlled oscillator, and wherein each metal damping resistor is configured to minimize mutual inductance between a respective lead connected to the respective pad and the controlled oscillator.

14. The system of claim 11 wherein each metal damping resistor has a positive temperature coefficient across an entire range of operating temperatures.

15. The system of claim 11 wherein each metal damping resistor is formed substantially away from the device circuitry.

16. The system of claim 11 wherein the metal damping resistor is formed in a plurality of metal layers on the substrate, the metal damping resistor comprising three or more metal layers separated from each other by dielectric layers, the metal layers being coupled together with metal vias extending through the dielectric layers to form the resistor.

17. The system of claim 11, where the first planar metal portion of the metal damping resistor comprises a first elongated conductor that zigzags back and forth in the plane of the first planar metal portion; where the second planar metal portion of the metal damping resistor comprises a second elongated conductor that zigzags back and forth in the plane of the second planar metal portion; and where the first elongated conductor is coupled to the second elongated conductor by the metal via that extends through the dielectric layer.

18. A media system comprising:
a communications device configured to receive an analog input signal and generate an output signal, the communications device includes:
communications device circuitry; and
a set of pad structures configured to transmit electrical signals to and from the communications device circuitry;

wherein each pad structure includes a pad, electrostatic discharge circuitry, and a metal damping resistor connected between the pad and the electrostatic discharge circuitry, the metal damping resistor being configured to conduct an electrostatic discharge between the pad and the electrostatic discharge circuitry;

a processing unit configured to generate a media signal in response to the output signal from the communications device;

where the metal damping resistor comprises a first planar metal portion separated from a second planar metal portion by a dielectric layer disposed therebetween, the plane of the first planar metal portion being oriented in substantially parallel relationship to the plane of the second planar metal portion; and where the first planar metal portion is coupled to the second planar metal portion by a metal via that extends through the dielectric layer between the first planar metal portion and the second planar metal portion in a direction that is substantially perpendicular to the plane of the first planar metal portion and the second planar metal portion; and where the electrostatic discharge circuitry comprises active circuitry formed on the substrate; where the first planar metal portion is coupled to the active circuitry on the substrate by a metal via that extends in a direction that is substantially perpendicular to the plane of the first planar metal portion and the second planar metal portion; and where the active circuitry is disposed between the substrate and the first planar metal portion, and where the first planar metal portion is disposed between the active circuitry and the second planar metal portion.

19. The media system of claim 18 further comprising:
a media output device configured to generate a media output in response to the media signal from the processing circuitry.

20. The media system of claim 19 further comprising:
an input/output unit configured to provide a control signal to the media output device.

21. The media system of claim 18 wherein the communications device circuitry includes a controlled oscillator, and wherein each metal damping resistor is configured to minimize mutual inductance between a respective lead connected to the respective pad and the controlled oscillator.

22. The media system of claim 18 wherein each metal damping resistor is formed substantially away from the communications device circuitry.

23. The media system of claim 18, where the first planar metal portion of the metal damping resistor comprises a first elongated conductor that zigzags back and forth in the plane of the first planar metal portion; where the second planar metal portion of the metal damping resistor comprises a second elongated conductor that zigzags back and forth in the plane of the second planar metal portion; and where the first elongated conductor is coupled to the second elongated conductor by the metal via that extends through the dielectric layer.

24. An apparatus formed on a substrate, the apparatus comprising:
a pad;
electrostatic discharge circuitry; and
a metal damping resistor connected between the pad and the electrostatic discharge circuitry, the metal damping resistor being configured to conduct an electrostatic discharge between the pad and the electrostatic discharge circuitry;
where the metal damping resistor comprises a first planar metal portion separated from a second planar metal portion by a dielectric layer disposed therebetween, the plane of the first planar metal portion being oriented in substantially parallel relationship to the plane of the second planar metal portion; and where the first planar metal portion is coupled to the second planar metal portion by a metal via that extends through the dielectric layer between the first planar metal portion and the second planar metal portion in a direction that is substantially perpendicular to the plane of the first planar metal portion and the second planar metal portion; and where the first planar metal portion of the metal damping resistor comprises a first elongated conductor that zigzags back and forth in the plane of the first planar metal portion; where the second planar metal portion of the metal damping resistor comprises a second elongated conductor that zigzags back and forth in the plane of the second planar metal portion; and where the first elongated conductor is coupled to the second elongated conductor by the metal via that extends through the dielectric layer.

* * * * *

UNITED STATES PATENT AND TRADEMARK OFFICE
CERTIFICATE OF CORRECTION

| | |
|---|---|
| PATENT NO. | : 8,355,227 B2 |
| APPLICATION NO. | : 12/640315 |
| DATED | : January 15, 2013 |
| INVENTOR(S) | : Henry Singor |

It is certified that error appears in the above-identified patent and that said Letters Patent is hereby corrected as shown below:

In claim 9, column 8, line 48, delete "meal".

In claim 9, column 8, line 55, delete "meal".

Signed and Sealed this
Nineteenth Day of February, 2013

Teresa Stanek Rea
*Acting Director of the United States Patent and Trademark Office*